(12) United States Patent
Kim et al.

(10) Patent No.: US 10,818,858 B2
(45) Date of Patent: Oct. 27, 2020

(54) ELECTROLUMINESCENT DEVICE AND DISPLAY DEVICE COMPRISING THE SAME

(71) Applicant: SAMSUNG ELECTRONICS CO., LTD., Suwon-si, Gyeonggi-do (KR)

(72) Inventors: Tae Ho Kim, Suwon-si (KR); Chan Su Kim, Seoul (KR); Kun Su Park, Seongnam-si (KR); Eun Joo Jang, Suwon-si (KR); Sung Woo Kim, Hwaseong-si (KR); Hongkyu Seo, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/058,176

(22) Filed: Aug. 8, 2018

(65) Prior Publication Data

US 2019/0296255 A1    Sep. 26, 2019

(30) Foreign Application Priority Data

Mar. 26, 2018 (KR) .................. 10-2018-0034392

(51) Int. Cl.
*H01L 29/06* (2006.01)
*H01L 51/50* (2006.01)
*H01L 51/56* (2006.01)
*H01L 51/52* (2006.01)
*H01L 51/00* (2006.01)

(52) U.S. Cl.
CPC ............ *H01L 51/502* (2013.01); *H01L 51/56* (2013.01); *H01L 51/0007* (2013.01); *H01L 51/0021* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/5218* (2013.01); *H01L 51/5234* (2013.01); *H01L 2251/303* (2013.01); *H01L 2251/5353* (2013.01); *H01L 2251/558* (2013.01)

(58) Field of Classification Search
None
See application file for complete search history.

(56) References Cited

U.S. PATENT DOCUMENTS

| 8,759,826 B2 * | 6/2014 | Oikawa ............... H01L 51/5076 257/40 |
| 2007/0096078 A1 | 5/2007 | Lee et al. |
| 2009/0188558 A1 | 7/2009 | Jen et al. |

(Continued)

FOREIGN PATENT DOCUMENTS

| CN | 105161635 A | 12/2015 |
| CN | 107046103 A | 8/2017 |

(Continued)

*Primary Examiner* — Hung K Vu
(74) *Attorney, Agent, or Firm* — Cantor Colburn LLP (57) ABSTRACT

An electroluminescent device and a display device including the same are disclosed. The electroluminescent device includes a first electrode, an electron transport layer disposed on the first electrode and including inorganic oxide particles, a self-assembled monolayer disposed on the electron transport layer, an emission layer disposed on the self-assembled monolayer and including light emitting particles, a hole transport layer disposed on the emission layer, and a second electrode disposed on the hole transport layer.

23 Claims, 6 Drawing Sheets

(56) References Cited

U.S. PATENT DOCUMENTS

2013/0015424 A1\* 1/2013 Chung .................. H01L 51/52
257/9
2017/0062749 A1 3/2017 Seo et al.

FOREIGN PATENT DOCUMENTS

| JP | 2003309322 | A | 10/2003 |
|----|------------|----|---------|
| KR | 20040106923 | A | 12/2004 |
| KR | 100734842 | B1 | 7/2007 |
| KR | 20130074815 | A | 7/2013 |
| KR | 101626525 | B1 | 6/2016 |
| KR | 101695442 | B1 | 1/2017 |
| KR | 20170027305 | A | 3/2017 |

\* cited by examiner

ELECTROLUMINESCENT DEVICE AND DISPLAY DEVICE COMPRISING THE SAME

CROSS-REFERENCE TO RELATED APPLICATION

This application claims priority to and the benefit of Korean Patent Application No. 10-2018-0034392 filed in the Korean Intellectual Property Office on Mar. 26, 2018, and all the benefits accruing therefrom under 35 U.S.C. § 119, the entire content of which is incorporated herein by reference.

BACKGROUND

1. Field

An electroluminescent device and a display device including the same are disclosed.

2. Description of the Related Art

Quantum dots are a nanocrystal semiconductor material having a diameter of less than or equal to around 10 nanometers (nm), which show quantum confinement effects. Quantum dots generate stronger light in a narrow wavelength region than phosphor. Quantum dots emit light when excited electrons transition from a conduction band to a valance band. Wavelengths of emitted light vary with particle size even for quantum dots including the same material. The wavelength of light emitted from quantum dots is shortened with a decrease in particle size, and the quantum dots may provide light in a desirable wavelength region by adjusting the sizes of the quantum dots.

The emission layer including quantum dots and the various kinds of electronic devices including the same may provide savings in the production costs, compared to an organic light emitting diode including an emission layer exhibiting phosphorescence and/or including a phosphor material, and the desirable color may be emitted by changing a size of quantum dots, without a need to use other organic materials in the emission layer for emitting other color lights.

SUMMARY

An electroluminescent device having improved luminous efficiency and life-span characteristics by preventing a leakage current and a display device including the same are provided.

According to an embodiment, an electroluminescent device includes a first electrode; an electron transport layer disposed on the first electrode and including inorganic oxide particles; a self-assembled monolayer disposed on the electron transport layer; an emission layer disposed on the self-assembled monolayer and including light emitting particles; a hole transport layer disposed on the emission layer; and a second electrode disposed on the hole transport layer.

The self-assembled monolayer may include a self-assembled mono-molecule attached to an upper surface of the electron transport layer.

The self-assembled monolayer may consist of self-assembled mono-molecules.

The self-assembled mono-molecule may include a first terminal end near the upper surface of the electron transport layer and a second terminal end farther from the upper surface of the electron transport layer and the first terminal end, and the first terminal end and the upper surface of the electron transport layer may be linked by a chemical bond.

The chemical bond may be a covalent bond, a hydrogen bond, or a combination thereof.

The second terminal end may include a C2 to C20 linear or branched alkyl group, an electron donating group, a hole blocking group, or a combination thereof.

The second terminal end may include the electron donating group, and the electron donating group may include an amine group, a benzylamine group, an oxadiazole group, or a combination thereof.

The second terminal end may include the hole blocking group, and the hole blocking group may include a triazine group, a triazole group, a quinoline group, a quinolone group, or a combination thereof.

A length of the self-assembled mono-molecule may be about 0.1 nanometers (nm) to about 10 nm.

The self-assembled mono-molecule may be soluble in a non-polar solvent.

The non-polar solvent may include a C6 to C20 linear or cyclic aliphatic hydrocarbon, a C5 to C20 aromatic hydrocarbon, chloroform, methylene chloride, ethyl acetate, or a combination thereof.

An average thickness of the self-assembled monolayer may be about 0.1 nm to about 5 nm.

The inorganic oxide particles may include ZnO, $TiO_2$, $ZrO_2$, $SnO_2$, $WO_3$, $Ta_2O_3$, or a combination thereof.

The inorganic oxide particles may be dispersible in a polar solvent.

The electron transport layer may consist of inorganic oxide particles.

An upper surface of the electron transport layer may include a first space that is filled with the inorganic oxide particles and a second space that is not filled with the inorganic oxide particle, and the self-assembled monolayer may fill at least one part of the second space.

The light emitting particles may include quantum dots.

The light emitting particles may include a core-shell structure.

The light emitting particles may include a Group II-VI compound that does not include Cd, a Group III-V compound, a Group IV-VI compound, a Group IV element or compound, a Group compound, a Group I-II-IV-VI compound that does not include Cd, or a combination thereof.

The light emitting particles may include a hydrophobic organic ligand.

According to an embodiment, a display device includes the electroluminescent device.

A method of forming an electroluminescent device includes disposing an electron transport layer on a first electrode, the electron transport layer including inorganic oxide particles; disposing a self-assembled monolayer on the electron transport layer; disposing an emission layer on the self-assembled monolayer, the emission layer including light emitting particles; disposing a hole transport layer on the emission layer; and disposing a second electrode on the hole transport layer to form the electroluminescent device.

An electroluminescent device includes an electron transport layer including an inorganic oxide particle; a self-assembled monolayer disposed on the electron transport layer, the self-assembled monolayer including a mono-molecule attached to the inorganic oxide particle; an emission layer disposed on the self-assembled monolayer and including light emitting particles, the light emitting particles including a Group II-VI compound that does not include Cd, a Group III-V compound, a Group IV-VI compound, a Group IV element or compound, a Group compound, a Group I-II-IV-VI compound that does not include Cd, or a combination thereof; and a hole transport layer disposed on the emission layer.

The mono-molecule may include an ester and a C2 to C20 linear or branched alkyl group.

An electroluminescent device having improved luminous efficiency and life-span characteristics through prevention of a leakage current may be provided.

In addition, as described above, a display device including an electroluminescent device having improved luminous efficiency and life-span characteristics may also be provided.

DETAILED DESCRIPTION

Example embodiments of the present disclosure will hereinafter be described in detail, and may be easily performed by a person having an ordinary skill in the related art. However, this disclosure may be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "bottom" and "upper," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "bottom" side of other elements would then be oriented on "upper" sides of the other elements. The exemplary term "bottom," can therefore, encompasses both an orientation of "bottom" and "upper," depending on the particular orientation of the figure. Similarly, if the device in one of the figures is turned over, elements described as "beneath" other elements would then be oriented "above" the other elements. The exemplary term "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "Group" may refer to a group of Periodic Table.

As used herein, "Group II" may refer to Group IIA and Group IIB, and examples of Group II metal may be Cd, Zn, Hg, and Mg, but are not limited thereto.

As used herein, examples of "Group II metal that does not include Cd" may refer to a Group II metal except Cd, for example Zn, Hg, Mg, etc.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group I" may refer to Group IA and Group IB, and examples may include Li, Na, K, Rb, and Cs, but are not limited thereto.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

In an embodiment, a particle diameter of a particle in the present disclosure may be quantified by a measurement to provide an average size of a group. The method may include a mode diameter providing the maximum value of the distribution, a median diameter corresponding to the center value of integral distribution curve, a variety of average diameters (numeral average, length average, area average, mass average, volume average, etc.), and the like. Unless particularly described otherwise, an average particle diameter refers to a numeral average diameter in the present disclosure, and the average particle diameter is obtained by measuring D50 (a particle diameter at a position of distribution rate of 50%).

In an embodiment, "soluble property" indicates a property that a solute is dissolved in a particular solvent. In an embodiment, when a solute is dissolved in a non-polar solvent, the corresponding solute may be stated to have a soluble property regarding the non-polar solvent, e.g., the solute may be stated to be soluble in the non-polar solvent, and when a solute is well dissolved in a polar solvent, the corresponding solute may be stated to have a soluble property regarding the polar solvent e.g., the solute may be stated to be soluble in the polar solvent.

"Aliphatic" means a saturated or unsaturated linear or branched hydrocarbon group. An aliphatic group may be an alkyl, alkenyl, or alkynyl group, for example.

"Alkyl" means a straight or branched chain, saturated, monovalent hydrocarbon group (e.g., methyl or hexyl).

"Amine group" has the general formula —NRR, wherein each R is independently hydrogen, a C1-C12 alkyl group, a C7-C20 alkylarylene group, a C7-C20 arylalkylene group, or a C6-C18 aryl group.

"Aryl" means a monovalent group formed by the removal of one hydrogen atom from one or more rings of an arene (e.g., phenyl or naphthyl).

"Arene" means a hydrocarbon having an aromatic ring, and includes monocyclic and polycyclic hydrocarbons wherein the additional ring(s) of the polycyclic hydrocarbon may be aromatic or nonaromatic. Specific arenes include benzene, naphthalene, toluene, and xylene.

"Aromatic" means an organic compound or group comprising at least one unsaturated cyclic group having delocalized pi electrons. The term encompasses both hydrocarbon aromatic compounds and heteroaromatic compounds.

The luminous efficiency of an emission layer including quantum dots is determined by quantum efficiency of the quantum dots, a balance of charge carriers, light extraction efficiency, a leakage current, and the like. That is, in order to improve luminous efficiency of an emission layer, there are methods of controlling excitons to be confined in an emission layer, smoothly transporting holes and electrons of a quantum dot, or preventing a leakage current.

Figure 1:
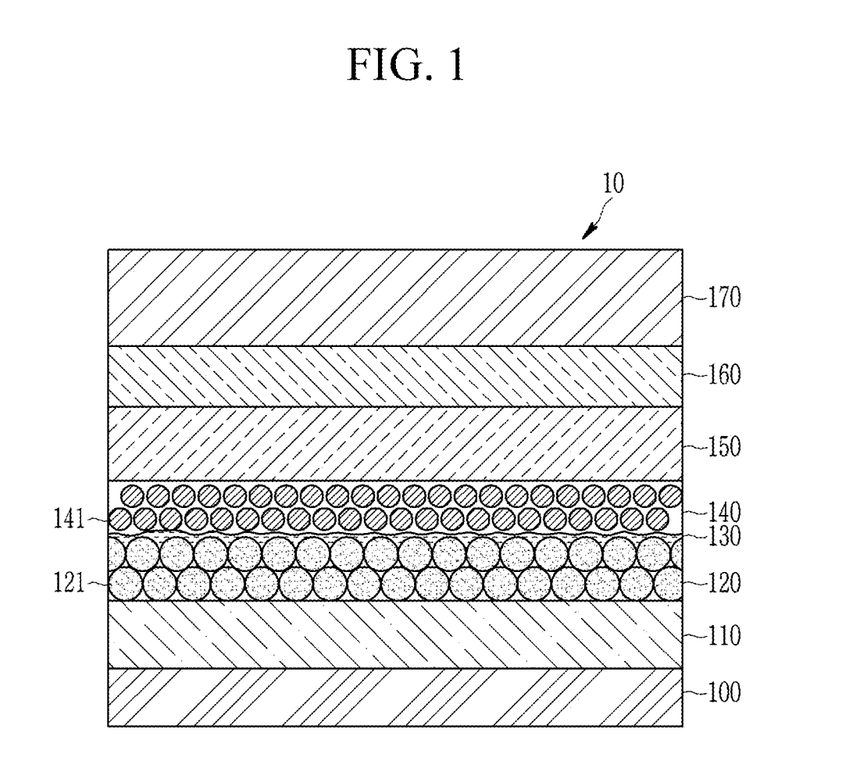
FIG. 1 is a schematic cross-sectional view showing an electroluminescent device according to an embodiment.

FIG. 1 is a schematic cross-sectional view showing an electroluminescent device according to an embodiment.

An electroluminescent device 10 according to an embodiment includes a first electrode 110, an electron transport layer 120 disposed on the first electrode 110 and including inorganic oxide particles 121, a self-assembled monolayer 130 disposed on the electron transport layer 120, an emission layer 140 disposed on the self-assembled monolayer 130 and including light emitting particles 141, a hole transport layer 150 disposed on the emission layer 140, a hole injection layer 160 that is disposed on the hole transport layer 150 and may be omitted considering a relationship with constituent elements, and a second electrode 170 disposed on the hole transport layer 150 and/or the hole injection layer 160.

That is, the electroluminescent device 10 has a stacked structure wherein the electron transport layer 120, the self-assembled monolayer 130, the emission layer 140, the hole transport layer 150, and the hole injection layer 160 are disposed between the first electrode 110 and the second electrode 170 facing each other.

The electroluminescent device 10 according to an embodiment supplies current to the emission layer 140 through the first electrode 110 and the second electrode 170, and causes electro-luminescence of the light emitting particles 141 to generate light. The electroluminescent device 10 may generate light in various wavelength regions according to materials, sizes, or fine structures of the light emitting particles 141 of the emission layer 140.

In an embodiment, the first electrode 110 may be directly connected to a driving power source that may function to provide current to the emission layer 140. The first electrode 110 may include a material having light transmittance in for example a visible light wavelength region, but is not limited thereto. The first electrode 110 may include a material having light transmittance in an infrared or ultraviolet (UV) wavelength region. For example, the first electrode 110 may be an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

The first electrode 110 according to an embodiment is not necessarily limited thereto and may further include a material having light transmittance in an infrared ray or ultraviolet (UV) wavelength region or a semi-permeable material selectively transmitting light in a particular wavelength region and conducting a function of reflecting light in a visible light wavelength region toward the second electrode 170.

In an embodiment, the first electrode 110 may be disposed on the substrate 100 as shown in FIG. 1. The substrate 100 may be a transparent insulating substrate or may be made of a ductile material. The substrate 100 may include glass or a polymer material in a film having a glass transition temperature (Tg) of greater than about 150° C. For example, the substrate 100 may include a COC (cyclo olefin copolymer) or COP (cyclo olefin polymer) material.

In an embodiment, the substrate 100 may support the electron transport layer 120, the self-assembled monolayer 130, the emission layer 140, the hole transport layer 150, and the hole injection layer 160 between the first electrode 110 and the second electrode 170. The substrate 100 of the electroluminescent device 10 according to an embodiment is not disposed under the first electrode 110, and the substrate 100 may be disposed on the second electrode 170 or may be omitted, as desired.

The second electrode 170 includes an optically transparent material and may function as a light-transmitting electrode to transmit light generated in the emission layer 140. In an embodiment, the second electrode 170 may include silver (Ag), aluminum (Al), copper (Cu), gold (Au), an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

The second electrode 170 according to an embodiment is not necessarily limited thereto and may include a semi-permeable material selectively transmitting light in a particular wavelength region and may conduct a function of reflecting light in a visible light wavelength region toward the first electrode 110.

When the second electrode 170 functions as a reflecting electrode, the first electrode 110 may be a light-transmitting electrode formed of a material transmitting light in for example a visible light wavelength region or a semi-permeable electrode selectively transmitting light in a particular wavelength region.

Each of the first electrode 110 and the second electrode 170 may be formed by depositing a material for forming an electrode on the substrate 100 or an organic layer by a method such as sputtering.

In the electroluminescent device 10 according to an embodiment, the first electrode 110 may respectively function as a cathode, and the second electrode 170 functions as an anode. The electroluminescent device 10 according to an embodiment may have an inverted structure of disposing the substrate 100 and each constituent element in the above order, as shown in FIG. 1.

The electroluminescent device 10 according to an embodiment is not necessarily limited thereto and may have various structures within a range of satisfying the aforementioned order of disposing each constituent element. For example, the substrate 100 may be disposed not beneath the first electrode 110 but on the second electrode 170.

In an embodiment, the electron transport layer 120 is disposed between the first electrode 110 and the emission layer 140 and plays a role of transporting electrons to the emission layer 140.

In an embodiment, a thickness of the electron transport layer 120 may be variously changed considering charge carrier balance of the hole transport layer 150, the hole injection layer 160 and/or the emission layer 140 in the device, and may be for example greater than or equal to about 25 nm, greater than or equal to about 30 nm, greater than or equal to about 35 nm, greater than or equal to about 40 nm, or greater than or equal to about 100 nm and, for example less than or equal to about 90 nm, less than or equal to about 80 nm, less than or equal to about 70 nm, less than or equal to about 60 nm, less than or equal to about 55 nm, or less than or equal to about 50 nm, or for example about 25 nm to about 100 nm, or about 30 nm to about 60 nm.

When the electron transport layer 120 is less than 25 nm thick, a void, a crack, and the like of the electron transport layer 120 may be increased, device characteristics may be deteriorated, and a carrier balance with other constituent elements of the electroluminescent device may not be provided, which will be described later.

When the electron transport layer 120 is greater than 100 nm thick, the emission layer 140 is supplied with electrons quickly and/or in a large quantity compared with holes, the electrons may meet the holes on the interface of the emission layer 140 and the hole transport layer 150 and emit light on the interface or move toward the hole transport layer 150 and/or the hole injection layer 160 and be quenched.

The electron transport layer 120 may include inorganic oxide particles 121. In an embodiment, the electron transport layer 120 may include at least two inorganic oxide particles 121. For example, the electron transport layer 120 may consist of, e.g., include only, the inorganic oxide particles 121. The electron transport layer 120 may be a cluster layer consisting of, e.g., including only, the inorganic oxide particles 121.

The inorganic oxide particles 121 according to an embodiment may be dispersible in a polar solvent. The dispersibility of the inorganic oxide particles 121 may be caused by a hydroxide group (—OH) on the surface thereof at room temperature. For example, as for ZnO particles, hydroxide groups (—OH), e.g., an excess of hydroxide groups (—OH), may be formed on the surface thereof at room temperature. When the ZnO particles are put in a polar solvent such as water, ethanol, and the like at room temperature, the ZnO particles may not be tangled with one another and may uniformly disperse in the polar solvent with a physical treatment such as stirring.

The inorganic oxide particles 121 are dispersed in the polar solvent to prepare a solution, and the solution may be coated on the first electrode 110 and dried to form the electron transport layer 120 as a cluster layer formed of the inorganic oxide particles 121. The inorganic oxide particles 121 may not be agglomerated in a particular region of the electron transport layer 120 and may be relatively uniformly dispersed.

In addition, the inorganic oxide particles 121 may have electron transport properties. The inorganic oxide particles 121 according to an embodiment may include for example ZnO, $TiO_2$, $ZrO_2$, $SnO_2$, $WO_3$, $Ta_2O_3$, or a combination thereof, but are not limited thereto.

An average particle diameter of the inorganic oxide particles 121 according to an embodiment may be for example less than or equal to about 70 nm, less than or equal to about 60 nm, less than or equal to about 50 nm, less than or equal to about 40 nm, less than or equal to about 30 nm, less than or equal to about 20 nm, or less than or equal to about 10 nm, and for example greater than or equal to about 1 nm, greater than or equal to about 2 nm, greater than or equal to about 3 nm, greater than or equal to about 4 nm, or greater than or equal to about 5 nm. When the average particle diameter of the inorganic oxide particles 121 is within the ranges, the electron transport layer 120 may exhibit desirable electron transport properties.

An electron injection layer easing injection of electrons and/or a hole blocking layer blocking movement of holes may be further disposed between the electron transport layer 120 and the first electrode 110.

The electron injection layer and the hole blocking layer may each have a desirably selected thickness. For example, each thickness may be in a range of greater than or equal to about 1 nm and less than or equal to about 500 nm but is not limited thereto. The electron injection layer may be an organic layer formed through deposition but may be omitted considering a thickness, a material, and the like of the electron transport layer 120 or the self-assembled monolayer 130.

The electron injection layer may include for example 1,4,5,8-naphthalene-tetracarboxylic dianhydride (NTCDA), bathocuproine (BCP), tris[3-(3-pyridyl)-mesityl]] borane (3TPYMB), LiF, Alq$_3$, Gaq$_3$, Inq$_3$, Znq$_2$, Zn(BTZ)$_2$, BeBq$_2$, ET204 (8-(4-(4,6-di(naphthalen-2-yl)-1,3,5-triazin-2-yl)phenyl)quinolone), 8-hydroxyquinolinato lithium (Liq), n-type metal oxide (e.g., ZnO, HfO$_2$, etc.), or a combination thereof, but is not limited thereto.

The hole blocking layer may include for example 1,4,5,8-naphthalene-tetracarboxylic dianhydride (NTCDA), bathocuproine (BCP), tris[3-(3-pyridyl)-mesityl] borane (3TPYMB), LiF, Alq$_3$, Gaq3, Inq3, Znq2, Zn(BTZ)$_2$, BeBq$_2$, or a combination thereof, and may be omitted considering thicknesses, materials, and the like of other constituent elements of the electroluminescent device 10.

The self-assembled monolayer 130 may be disposed on the upper surface of the electron transport layer 120. In an embodiment, the self-assembled monolayer 130 may be attached to the upper surface of the electron transport layer 120.

The self-assembled monolayer 130 may function as a kind of surface-modification layer changing physical and chemical characteristics of the upper surface of the electron transport layer 120. In an embodiment, the self-assembled monolayer 130 may conduct a function of removing or minimizing a void and/or a crack on the upper surface of the electron transport layer 120.

In an embodiment, the self-assembled monolayer 130 may have a different average thickness depending on a material forming the self-assembled monolayer 130, a thickness of the electron transport layer 120, a material of the first electrode 110, and the like, and the average thickness thereof may be greater than or equal to about 0.1 nm, greater than or equal to about 0.5 nm, greater than or equal to about 1 nm, or greater than or equal to about 5 nm, and for example less than or equal to about 4 nm, or about 0.5 nm to about 5 nm.

When the self-assembled monolayer 130 has an average thickness of less than about 0.1 nm, an effect of removing a void and/or a crack on the upper surface of the electron transport layer 120 may not be significant. Improved luminous efficiency and life-span characteristics of the electroluminescent device 10 for example due to the self-assembled monolayer 130 may be difficult to obtain.

When the self-assembled monolayer 130 has an average thickness of greater than about 5 nm, the self-assembled monolayer 130 may prevent and/or block movement of electrons, and it may be difficult or impossible to smoothly transport the electrons.

Figure 2:
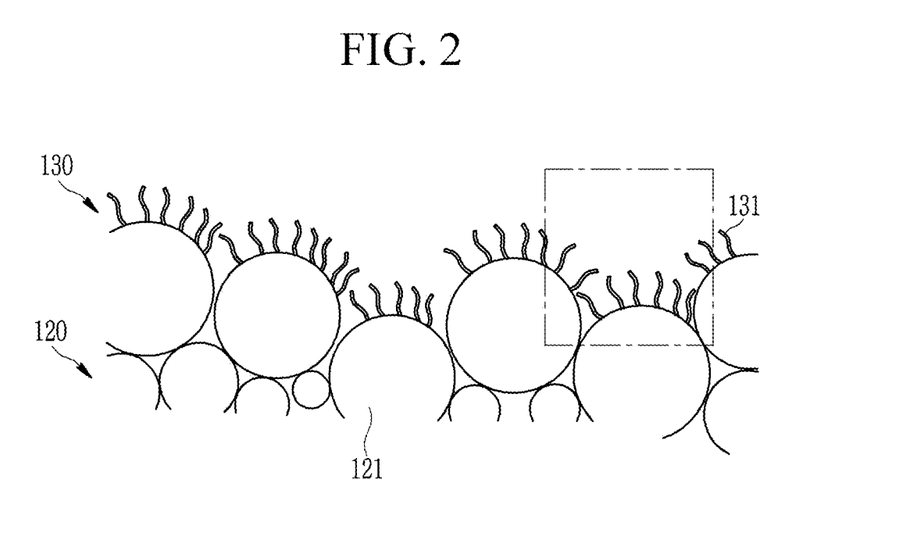
FIG. 2 is a schematic view showing disposition relationship of an electron transport layer and a self-assembled monolayer in the electroluminescent device according to an embodiment.

FIG. 2 is a schematic view showing disposition relationship of an electron transport layer and a self-assembled monolayer in an electroluminescent device according to an embodiment.

Referring to FIG. 2, the self-assembled monolayer 130 may include self-assembled mono-molecules 131. As used herein, a "mono-molecule" means the constituent molecules of the self-assembled monolayer 130. The self-assembled monolayer 130 may include at least two self-assembled mono-molecules 131. The self-assembled monolayer 130 may be a cluster layer formed of at least two self-assembled mono-molecules 131.

Referring to FIG. 2, the electron transport layer 120 may have an upper surface including a first space filled with inorganic oxide particles and a second space not filled with the inorganic oxide particles (a dotted lined quadrangle in FIG. 2). The upper surface of the electron transport layer 120 may have a height deviation corresponding to the second space according to a size deviation of the inorganic oxide particles 121, a thickness of the electron transport layer 120, and the like.

The second space may work as a leakage path of electrons during operation of a device, and even though the electron transport layer 120 is formed by using inorganic oxide having desirable dispersibility in a polar solvent, the second space may not be completely removed.

The electroluminescent device 10 according to an embodiment may have the electron transport layer 120 having at least a part of the second space filled with the self-assembled monolayer 130 as shown in FIG. 2. For example, the whole second space of the electron transport layer 120 may be filled with the self-assembled monolayer 130.

In this way, when the self-assembled monolayer 130 fills at least a part of the second space, the electron leakage path on the upper surface of the electron transport layer 120 may be removed or minimized. The electron transport layer 120 may prevent or minimize excitons produced from the emission layer 140 from being released through the electron leakage path and quenched. The formation of more auger-assisted electrons may be prevented or minimized, and a possibility of electron-hole recombination in the emission layer 140 may be increased.

In addition, an electron transport capability of the electron transport layer 120 may be improved through reduction/removal of the second space, and a carrier balance between electrons and holes may be set in, e.g., determined by, the emission layer 140.

The electroluminescent device 10 according to an embodiment may exhibit improved luminous efficiency and life-span characteristics, as electron transport capability of the electron transport layer 120 is improved, and exciton quench is prevented or minimized.

Figure 3:
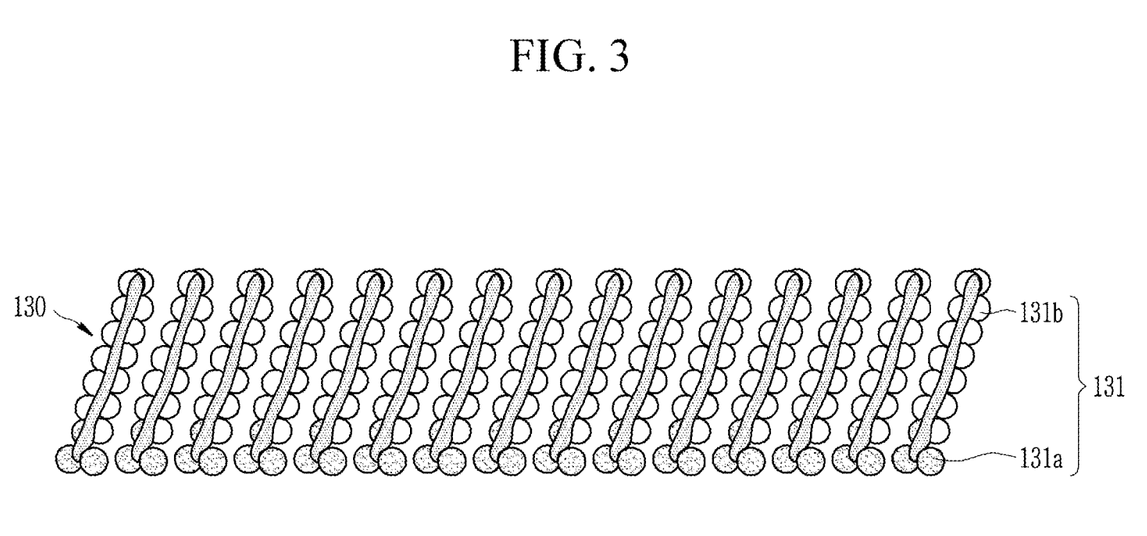
FIG. 3 is a schematic view enlarging a part of the self-assembled monolayer of the electroluminescent device according to an embodiment.

FIG. 3 is a schematic view enlarging a part of the self-assembled monolayer of the electroluminescent device according to an embodiment.

Referring to FIG. 3, the self-assembled mono-molecule 131 may have a first terminal end 131a and a second terminal end 131b. The first terminal end 131a may be disposed to be near the upper surface of the electron transport layer 120 and the second terminal end 131b may be disposed to be farther from the upper surface of the electron transport layer 120 than that of the first terminal end 131a.

In an embodiment, the first terminal end 131a may form a chemical bond with an upper surface of the electron transport layer 120, i.e., the first terminal end 131a and the upper surface of the electron transport layer 120 may be linked by a chemical bond. The chemical bond may be a covalent bond, a hydrogen bond, or a combination thereof.

The second terminal end 131b may exhibit a different chemical property from that of the first terminal end 131a. The second terminal end 131b is not chemical bonded with the upper surface of the electron transport layer 120 and is spaced apart from the upper surface of the electron transport layer 120 by a predetermined distance.

In an embodiment, the second terminal end 131b may include a predetermined functional group to exhibit the chemical property of the second terminal end 131b. Examples of the predetermined functional group may be a C2 to C20 linear or branched alkyl group, an electron donating group, a hole blocking group, or a combination thereof.

Examples of the electron donating group may be an amine group, a benzylamine group, an oxadiazole group, and the like.

Examples of the hole blocking group may be a triazine group, a triazole group, a quinoline group, a quinolone group, and the like.

The second terminal end 131b of the self-assembled mono-molecule 131 according to an embodiment may include a hydrophobic alkyl group, an electron donating group with a consideration to electron transport properties inside a device, or a hole blocking group in order to suppress movement of holes, as described above. A kind of functional group included in the second terminal end 131b may differ depending on a charge carrier balance inside a device, a material of the self-assembled mono-molecule 131, and the like.

Figure 4:
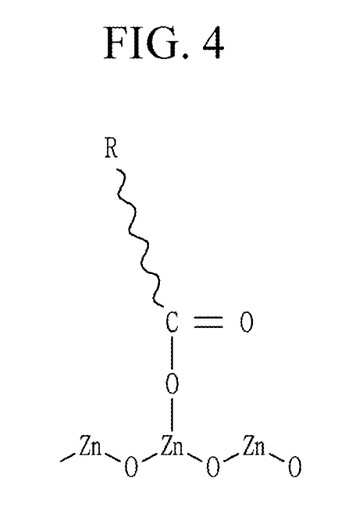
FIGS. 4 to 6 are schematic views showing chemical bond relationships of the electron transport layer and the self-assembled monolayer in the electroluminescent device according to an embodiment.
Figure 5:
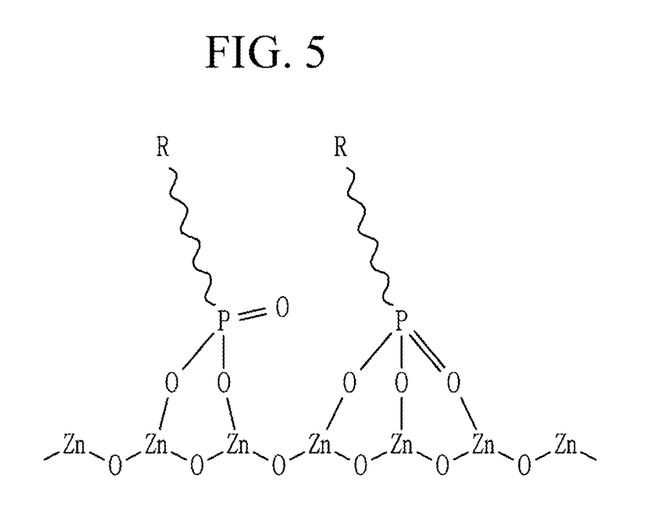
Figure 6:
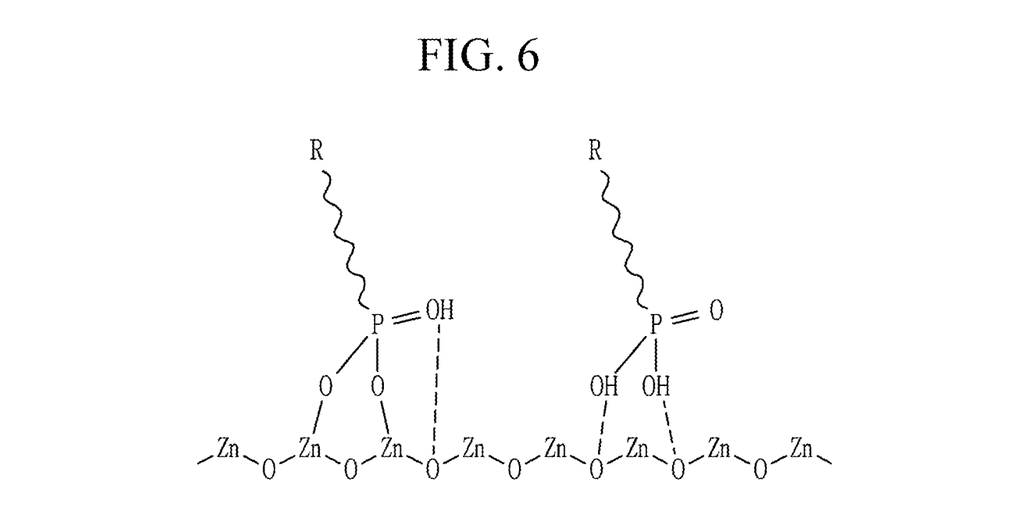

FIGS. 4 to 6 are schematic views showing chemical bond relationships between an electron transport layer and a self-assembled monolayer inside an electroluminescent device according to an embodiment.

Referring to FIG. 4, the self-assembled mono-molecule may have an ester group as a first terminal end and the above predetermined functional group as a second terminal end (R). One of two oxygen atoms forming the ester group of the first terminal end may form a covalent bond with a Zn moiety of an inorganic oxide particle (ZnO).

Referring to FIG. 5, the self-assembled mono-molecule has a phosphonyl group as the first terminal end and the above predetermined functional group as the second terminal end (R). At least two of three oxygen atoms forming the phosphonyl group of the first terminal end may form a covalent bond with the Zn moiety of the inorganic oxide particle (ZnO) as shown in FIG. 5.

Referring to FIG. 6, the self-assembled mono-molecule has a phosphonyl group or a phosphinic acid group as the first terminal end and the above predetermined functional group as a second terminal end (R). When hydrogen is bound to one of three oxygen atoms forming the phosphonyl group of the first terminal end in the self-assembled mono-molecule, the other two oxygen atoms have a covalent bond with a Zn moiety, and the oxygen atom bound to hydrogen has a hydrogen bond with an oxygen moiety of an inorganic oxide particle.

When the self-assembled mono-molecule has a phosphinic acid group as the first terminal end, at least one of the three oxygen atoms is bound to hydrogen, and the hydrogen has a hydrogen bond with the oxygen moiety of the inorganic oxide particle.

The first terminal end of the self-assembled mono-molecule has either a covalent bond or a hydrogen bond or both a covalent bond and a hydrogen bond with the upper surface of the electron transport layer. In addition, the second terminal end thereof includes the above alkyl group, an electron donating group, a hole blocking group, or a combination thereof, and forms no chemical bond with the upper surface of the electron transport layer.

The self-assembled monolayer 130 may be formed by coating a solution prepared by dispersing the self-assembled mono-molecule 131 in a, preferably a non-polar solvent, on the electron transport layer 120 and drying it.

In an embodiment, the self-assembled mono-molecule 131 may have a soluble property, i.e., be soluble, in a non-polar solvent unlike the above inorganic oxide particles 121. Furthermore, the self-assembled monolayer 130 also has a soluble property, i.e., is soluble, in a non-polar solvent for example due to solvent selectivity of the self-assembled mono-molecule 131.

In an embodiment, compounds as the non-polar solvent may include for example a C6 to C20 linear or cyclic aliphatic hydrocarbon, a C5 to C20 aromatic hydrocarbon, chloroform, methylene chloride, ethyl acetate, or a combination thereof.

In some embodiments the self-assembled mono-molecule 131 is soluble in protic polar solvents such as ethylene glycol, diethylene glycol, or a combination thereof.

Since the self-assembled mono-molecule 131 and the self-assembled monolayer 130 have a soluble property in a non-polar solvent, and the self-assembled monolayer 130 may be easily formed on the upper surface of the electron transport layer 120. In other words, since the electron transport layer 120 and the self-assembled monolayer 130 have a different solvent selectivity, and damage of the electron transport layer 120 by a solvent during formation of the self-assembled monolayer 130 on the electron transport layer 120 may be prevented or minimized.

A length from the first terminal end 131a to the second terminal end 131b, that is, a length of the self-assembled mono-molecule 131 may differ depending on a kind of self-assembled mono-molecule 131, chemical properties of the first and second terminal ends 131a and 131b, and the like, and may be for example, greater than or equal to about 0.1 nm, greater than or equal to about 0.5 nm, greater than or equal to about 1 nm, greater than or equal to about 2 nm, greater than or equal to about 3 nm, less than or equal to about 15 nm, or less than or equal to about 10 nm.

When the self-assembled mono-molecule 131 has a length of less than about 1 nm, the self-assembled mono-molecule 131 may be formed to fill a second space on the upper surface of the electron transport layer 120, and the effect of the self-assembled mono-molecule 131 may not be significant.

When the self-assembled mono-molecule 131 has a length of greater than 15 nm, electron transport properties of the electron transport layer 120 may be deteriorated by self-assembled mono-molecules having an electron transport capability that is less than that of the electron transport layer 120.

In this way, in the electroluminescent device 10 according to an embodiment, a void and/or a crack on the upper surface of the electron transport layer 120 may be minimized or removed by using the self-assembled monolayer 130, and the electroluminescent device 10 may exhibit improved luminous efficiency and life-span characteristics.

The emission layer 140 may be disposed on the self-assembled monolayer 130. The emission layer 140 may be disposed directly on the self-assembled monolayer 130 and include at least two light emitting particles.

The emission layer 140 is a site where electrons and holes, transported by a current supplied from the first electrode 110 and the second electrode 170, are combined to generate excitons, and the generated excitons transition from an exited state to a ground state to emit light in a wavelength corresponding to the size of the light emitting particles 141.

The emission layer 140 may emit light in a predetermined wavelength region. The predetermined wavelength region belongs to a visible light region, for example, a first wavelength region of about 380 nm to about 488 nm, a second wavelength region of about 490 nm to about 510 nm, a third wavelength region of about 510 nm to about 580 nm, a fourth wavelength region of about 582 nm to about 600 nm, or a fifth wavelength region of about 620 nm to about 680 nm.

In an embodiment, the light emitting particles 141 may include quantum dots. That is, the light emitting particles 141 may include or consist of quantum dots, or one of the light emitting particles 141 may include or consist of quantum dots and the other may include or consist of electroluminescent devices, for example commercially available phosphors that are separate or different from quantum dots.

The quantum dots have a discontinuous energy bandgap for example due to the quantum confinement effect and incident light may be converted into light having a particular wavelength and then radiated. When the light emitting particles 141 include or consist of quantum dots, the emission layer 140 may produce light having desirable color reproducibility and color purity.

In an embodiment, materials of the quantum dots are not particularly limited and commercially available quantum dots may be used. For example, each of the light emitting particles 141 according to an embodiment may include a Group II-VI compound that does not include Cd, a Group III-V compound, a Group IV-VI compound, a Group IV element or compound, a Group compound, a Group I-II-IV-VI compound that does not include Cd, or a combination thereof. That is, each of light emitting particles 141 according to an embodiment may be a non-cadmium quantum dot. When the light emitting particles 141 are quantum dots including or consisting of a non-cadmium material, the light emitting particles 141 may have minimal or no toxicity compared with a cadmium quantum dot, the light emitting particles 141 may not be dangerous, and the light emitting particles 141 may be environmentally-friendly.

The Group II-VI compound may be a binary element compound of ZnS, ZnSe, ZnTe, ZnO, HgS, HgSe, HgTe, MgSe, MgS, or a mixture thereof; a ternary element compound of ZnSeS, ZnSeTe, ZnSTe, HgSeS, HgSeTe, HgSTe, HgZnS, HgZnSe, HgZnTe, MgZnSe, MgZnS, or a mixture thereof; and a quaternary element compound of HgZnTeS, HgZnSeS, HgZnSeTe, HgZnSTe, or a mixture thereof. The Group II-VI compound may further include a Group III metal.

The Group III-V compound may be a binary element compound of GaN, GaP, GaAs, GaSb, AlN, AlP, AlAs, AlSb, InN, InP, InAs, InSb, or a mixture thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, InZnP, or a mixture thereof; and a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof. The Group III-V compound may further include a Group II metal (InZnP).

The Group IV-VI compound may be a binary element compound of SnS, SnSe, SnTe, PbS, PbSe, PbTe, or a mixture thereof; a ternary element compound of SnSeS, SnSeTe, SnSTe, PbSeS, PbSeTe, PbSTe, SnPbS, SnPbSe, SnPbTe, or a mixture thereof; and a quaternary element compound of SnPbSSe, SnPbSeTe, SnPbSTe, or a mixture thereof. Examples of the Group compound may be $CuInSe_2$, $CuInS_2$, CuInGaSe, and CuInGaS, are not limited thereto. Examples of the Group I-II-IV-VI compound may be CuZnSnSe and CuZnSnS, are not limited thereto. Examples of the Group IV compound may be a single substance of Si, Ge, or a mixture thereof; and a binary element compound of SiC, SiGe, or a mixture thereof.

The binary element compound, the ternary element compound or the quaternary element compound respectively exist in a uniform concentration in the particle or in partially different concentrations in the same particle.

According to an embodiment, the quantum dots may have a core-shell structure including one semiconductor nanocrystal core and another semiconductor nanocrystal shell surrounding the core. The core and the shell may have a concentration gradient wherein the concentration of the element(s) of the shell decreases toward the core. In addition, the quantum dots may have one semiconductor nanocrystal core and multi-shells surrounding the core. Herein, the multi-layered shell structure has a structure of two or more shells and each layer may have a single composition or an alloy or may have a concentration gradient.

In an embodiment, the light emitting particles may have a core-shell structure. When the light emitting particles have a core-shell structure, a material composition of the shell has a larger energy bandgap than that of the core, which may exhibit an effective quantum confinement effect. The embodiment is not limited thereto. In the multi-layered shell, a shell that is outside of the core has may have a higher energy bandgap than a shell that is near the core and quantum dots may have an ultraviolet (UV) to infrared wavelength range.

The quantum dots may have quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, or even 100%.

In a display, the quantum dots may have a relatively narrow spectrum so as to improve color purity or color reproducibility. The quantum dots may have for example a full width at half maximum (FWHM) of a photoluminescence wavelength spectrum of less than or equal to about 45 nm, less than or equal to about 40 nm, or less than or equal to or about 30 nm. Within the ranges, color purity or color reproducibility of a device may be improved.

The quantum dots may have a particle diameter (the longest diameter for a non-spherically shaped particle) of about 1 nm to about 100 nm. For example, the quantum dots may have a particle diameter of about 1 nm to about 20 nm, for example, about 2 nm (or about 3 nm) to about 15 nm.

In addition, the shapes of the quantum dots may not be particularly limited. For example, the quantum dots may be spherical, oval, tetrahedral, pyramidal, cuboctahedral, cylindrical, polyhedral, multi-armed, a cube nanoparticle, a nanotube, a nanowire, a nanofiber, a nanosheet, or a combination thereof.

The quantum dots may have any suitable cross-sectional shape.

The quantum dots may be commercially available or may be synthesized in any suitable method. For example, several nano-sized quantum dots may be synthesized according to a wet chemical process. In the wet chemical process, precursors react in an organic solvent to grow crystal particles, and the organic solvent or a ligand compound may coordinate, e.g., be bound to, the surface of the quantum dot, controlling the growth of the crystal. The organic solvent coordinated on the surface of the quantum dots may affect stability of a device, and excess organic materials that are not coordinated on the surface of the nanocrystals may be removed by pouring the organic solvent in excess non-solvent, and centrifuging the resulting mixture. Examples of the non-solvent may be acetone, ethanol, methanol, and the like, but are not limited thereto. After the removal of excess organic materials, the amount of the organic materials coordinated on the surface of the quantum dots may be less than or equal to about 50% by weight, for example, less than or equal to about 30 wt %, less than or equal to about 20 wt %, or less than or equal to about 10 wt %, based on a weight of the quantum dot. The organic material may include a ligand compound, an organic solvent, or a combination thereof.

The quantum dot may have for example an organic ligand having a hydrophobic moiety bound to a surface of the quantum dot. In an embodiment, the organic ligand having the hydrophobic moiety may be RCOOH, $RNH_2$, $R_2NH$, $R_3N$, RSH, $R_3PO$, $R_3P$, ROH, RCOOR', RPO $(OH)_2$, $R_2POOH$ (wherein, R and R' are independently a C5 to C24 alkyl group, a C5 to C24 alkenyl group, a C5 to C20 alicyclic group, or a C5 to C20 aryl group), a polymeric organic ligand, or a combination thereof. The organic ligand may be a mono-functional group organic ligand and the functional group may be bound to the surface of the quantum dots.

When the quantum dot has an organic ligand having a hydrophobic moiety, the light emitting particle according to an embodiment may be overly hydrophobic for example due to attachment of the organic ligand to the quantum dot.

In this way, when the light emitting particle includes the quantum dot and the hydrophobic organic ligand, an emission layer also becomes hydrophobic. When the emission layer 140 is hydrophobic, the emission layer 140 may be damaged by a non-polar solvent. When the emission layer 140 contacts the non-polar solvent, the emission layer 140 may get damaged by the non-polar solvent and deteriorate device characteristics.

The electroluminescent device 10 according to an embodiment includes the emission layer 140 formed on the self-assembled monolayer 130 after forming the self-assembled monolayer 130 first. In this way, the electroluminescent device 10 has an inverted structure of disposing the electron transport layer 120, the self-assembled monolayer 130, and the emission layer 140 in order on the first electrode 110 and may prevent damage of the non-polar solvent on the emission layer during formation of the self-assembled monolayer 130.

In an embodiment, the hole transport layer 150 may be formed of a p-type semiconductor material or a material doped with a p-type dopant. For example, the hole transport layer 150 may include a PEDOT [poly(3,4-ethylenedioxythiophene)] derivative, a PSS [poly(styrene sulfonate)] derivative, a poly-N-vinylcarbazole (PVK) derivative, a polyphenylenevinylene derivative, a poly p-phenylene vinylene (PPV) derivative, a polymethacrylate derivative, a poly(9,9-octylfluorene) derivative, a poly(spiro-fluorene) derivative, TCTA (tris(4-carbazolyl-9-ylphenyl)amine), TPD (N,N'-diphenyl-N,N'-bis(3-methylphenyl)-(1,1'-biphenyl)-4,4'-diamine), NPB (N,N'-di(naphthalen-1-yl)-N—N'-diphenyl-benzidine), m-MTDATA (tris(3-methylphenylphenylamino)-triphenylamine), TFB (poly(9,9'-dioctylfluorene-co-N-(4-butylphenyl)diphenylamine)), PFB (poly(9,9-dioctylfluorene)-co-N,N-diphenyl-N,N-di-(p-butylphenyl)-1,4-diaminobenzene), poly-TPD, metal oxides such as NiO or $MoO_3$, or a combination thereof, but is not limited thereto.

This hole transport layer 150 increases a life-span of a luminescent device and decreases a turn-on voltage at which the electroluminescent device 10 starts to work. For example, the hole transport layer 150 formed of a polymer material such as PEDOT, PSS, PPV, PVK, TCTA, TPD, NPB, MTDATA, TFB, PFB, poly-TPD, and the like and may have relatively strong resistance characteristics against a harmful material such as oxygen, moisture, or the like compared with a low molecular organic material and high resistance against crystallization.

The hole transport layer 150 may be formed in a wet coating method such as spin coating and the like. The hole transport layer 150 may not only be formed on the emission layer 140 but may also be formed by using a polar solvent in order to minimize an influence on the emission layer 140, when the emission layer 140 is hydrophobic.

For example, when the polymer such as PPV and the like is used to form a thin film on the emission layer 140, the hole transport layer 150 include or consisting of a PPV thin film is obtained by spin-coating a precursor solution including a PPV precursor polymer and a polar solvent (e.g., water, methanol, ethanol, etc.) on the emission layer 140, and heat-treating it, for example, under an inert gas atmosphere of $N_2$ or vacuum at about 250° C. to about 300° C. for about 3 hours.

The hole injection layer 160 may be disposed between the hole transport layer 150 and the second electrode 170. The hole injection layer 160 may supply holes into the emission layer 140 together with the hole transport layer 150. The hole injection layer 160 may be omitted considering a thickness, a material, and the like of the hole transport layer 150.

The hole injection layer 160 may be formed of a p-type semiconductor material or a material doped with a p-type dopant like the hole transport layer 150. For example, the hole injection layer 160 may include a PEDOT [poly(3,4-ethylenedioxythiophene)] derivative, a PSS [poly(styrene sulfonate)] derivative, a poly-N-vinylcarbazole (PVK) derivative, a polyphenylenevinylene derivative, a poly p-phenylene vinylene (PPV) derivative, a polymethacrylate derivative, a poly(9,9-octylfluorene) derivative, a poly (spiro-fluorene) derivative, TCTA (tris(4-carbazolyl-9-ylphenyl)amine), TPD (N,N'-diphenyl-N,N'-bis(3-methylphenyl)-(1,1'-biphenyl)-4,4'-diamine), NPB (N,N'-di(naphthalen-1-yl)-N—N'-diphenyl-benzidine), m-MTDATA (tris(3-methylphenylphenylamino)-triphenylamine), TFB (poly(9,9'-dioctylfluorene-co-N-(4-butylphenyl)diphenylamine)), PFB (poly(9,9-dioctylfluorene)-co-N,N-diphenyl-N,N-di-(p-butylphenyl)-1,4-diaminobenzene), poly-TPD, metal oxides such as NiO or $MoO_3$, or a combination thereof, but is not limited thereto.

A photoluminescence direction of the electroluminescent device 10 according to an embodiment is not particularly limited. The electroluminescent device 10 according to an embodiment may be driven in a method of inverted front photoluminescence, bottom photoluminescence, or both side photoluminescence.

In this way, the electroluminescent device 10 according to an embodiment has an inverted structure and also, a structure of disposing the self-assembled monolayer 130 between the electron transport layer 120 and the emission layer 140. The electroluminescent device 10 according to an embodiment may minimize a void, a crack, and the like on the upper surface of the electron transport layer 120 by using the self-assembled monolayer 130 and damage of the emission layer 140 may be minimized by forming the self-assembled monolayer 130 using a non-polar solvent before forming the emission layer 140. The electroluminescent device 10 according to an embodiment may minimize a leakage current and improve luminous efficiency and life-span characteristics.

Hereinafter, a display device including the electroluminescent device 10 is described.

A display device according to an embodiment includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices have the same structure as the electroluminescent device 10 and the wavelengths of the lights emitted from each quantum dots may be different from each other.

In an embodiment, the first electroluminescent device is a red device emitting red light, the second electroluminescent device is a green device emitting green light, and the third electroluminescent device is a blue device emitting blue light. The first to third electroluminescent devices may be pixels expressing red, green, and blue, respectively, in the display device.

An embodiment is not necessarily limited thereto, and the first to third electroluminescent devices may respectively express magenta, yellow, cyan, or may express other colors.

One of the first to third electroluminescent devices may be the electroluminescent device 10. In this case, the third electroluminescent device displaying at least blue desirably may be the electroluminescent device 10.

In the display device according to an embodiment, a hole injection layer, a hole transport layer, an electron transport layer, an electron injection layer, and a hole blocking layer except an emission layer of each pixel may be integrated to form a common layer. An embodiment is not limited thereto. A hole injection layer, a hole transport layer, an electron transport layer, an electron injection layer, and a hole blocking layer may be independently formed in each pixel of the display device, or at least one of a hole injection layer, a hole transport layer, an electron transport layer, an electron injection layer, and a hole blocking layer may form a common layer and remaining layers may form a separate independent layer.

The substrate may be a transparent insulating substrate or may be made of a ductile material. The substrate may include glass or a polymer material in a film having a glass transition temperature (Tg) of greater than about 150° C. For example, the substrate may include a COC (cycloolefin copolymer) or COP (cycloolefin polymer) material. All of the first to third electroluminescent devices are formed on the substrate. That is, a substrate of the display device according to an embodiment provides a common layer.

The driving circuit is disposed on the substrate and is independently connected to each of the first to third electroluminescent devices. The driving circuit may include a scan line, a data line, a driving power source line, a common power source line, or a combination thereof, thin film transistors (TFT) connected to the wire and corresponding to one organic light emitting diode, a capacitor, or a combination thereof.

As described above, a display device according to an embodiment may prevent an internal leakage current in an electroluminescent device and may improve luminous efficiency and life-span characteristics. The display device according to an embodiment may exhibit improved photoluminescence characteristics with a relatively small amount of electricity.

Hereinafter, the embodiments are illustrated in more detail with reference to examples. However, these examples are exemplary, and the present disclosure is not limited thereto.

Example 1

An indium-tin oxide (ITO) layer is deposited on a glass substrate, and a ZnO cluster layer is formed to be about 40 nanometers (nm) to 45 nm thick by preparing a composition for an electron transport layer by dispersing 3 millimoles (mmol) of ZnO particles having an average particle diameter of 3 nm in ethanol, spin-coating the composition at 4000 revolutions per minute (rpm) for 40 seconds, and drying the composition at 80° C. for 30 minutes.

Subsequently, a self-assembled monolayer having an average thickness of about 1 nm is formed by coating a composition for a self-assembled monolayer on the ZnO cluster layer at 4000 rpm and drying the composition at 80° C. after preparing the composition by dissolving 2 weight percent (wt %) of methacrylic acid in hexane. Self-assembled mono-molecules included in the self-assembled monolayer may be about 0.1 nm to 1 nm long. Subsequently, the coated self-assembled monolayer is washed with chloroform once or twice to remove non-reacting self-assembled mono-molecules.

Then, a 25 nm-thick blue emission layer is formed on the self-assembled monolayer by coating a composition for an emission layer after preparing the composition by dispersing blue quantum dots (ZnTeSe), oleic acid, and a binder in octane and then, heating the composition at 80° C.

Subsequently, a TCTA layer is formed by coating a composition for a hole transport layer on the blue emission layer after preparing the composition by dissolving TCTA in methanol and then, heating the composition at a high temperature.

On the TCTA layer, a $MoO_3$ layer as a hole injection layer is formed by depositing $MoO_3$.

On the $MoO_3$ layer, an aluminum (Al) layer is deposited to manufacture an electroluminescent device (ITO/ZnO cluster layer/self-assembled monolayer/blue emission layer/TCTA/$MoO_3$/Al) of Example 1.

Example 2

An electroluminescent device (ITO/ZnO cluster layer/self-assembled monolayer/blue emission layer/TCTA/$MoO_3$/Al) is manufactured according to the same method as Example 1 except for preparing a composition for an emission layer by dispersing blue quantum dots (ZnTeSe), dodecane thiol, and a binder in octane.

Comparative Example 1

An electroluminescent device (ITO/ZnO cluster layer/blue emission layer/TCTA/$MoO_3$/Al) is manufactured according to the same method as Example 1 except for forming a blue emission layer directly on a ZnO cluster layer without forming the self-assembled monolayer in Example 1.

Comparative Example 2

An electroluminescent device (ITO/ZnO cluster layer/blue emission layer/TCTA/$MoO_3$/Al) is manufactured according to the same method as Example 2 except for forming a blue emission layer directly on a ZnO cluster layer without forming the self-assembled monolayer in Example 2.

Evaluation 1: Photoluminescence Characteristics of Electroluminescent Device

Figure 7:
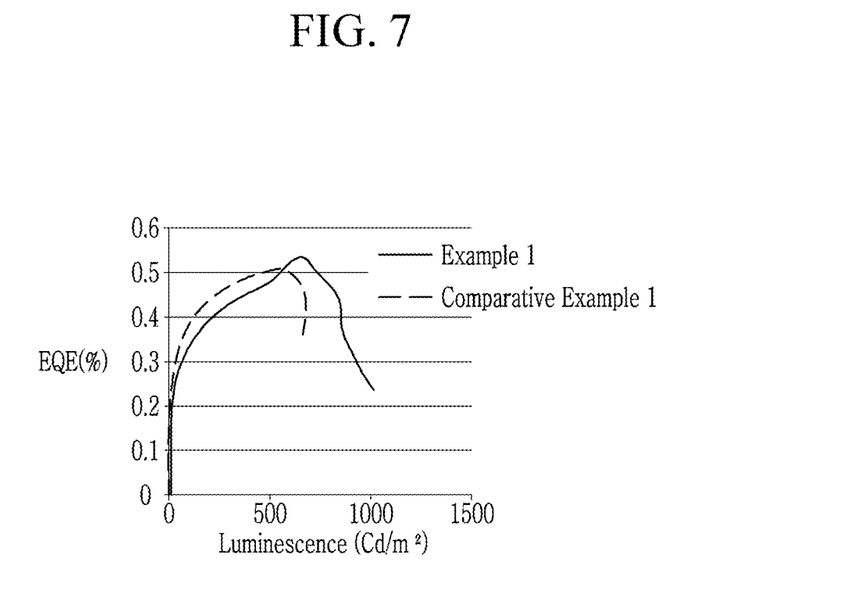
FIG. 7 is a graph of external quantum efficiency (EQE) (%) versus luminescence (candela per square meter (Cd/$m^2$)) of the electroluminescent devices of Example 1 and Comparative Example 1.
Figure 8:
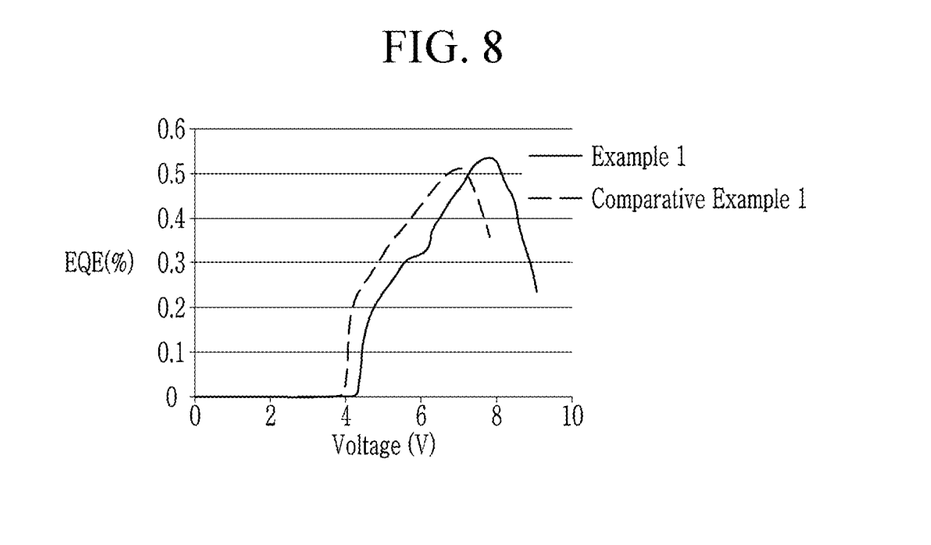
FIG. 8 is a graph of external quantum efficiency (EQE) (%) versus voltage (volts (V)) of the electroluminescent devices of Example 1 and Comparative Example 1.

Luminance-external quantum efficiency (EQE) relationship and voltage-external quantum efficiency (EQE) of the electroluminescent devices of Example 1 and Comparative Example 1 are respectively shown in FIGS. 7 and 8.

FIG. 7 is a graph showing luminance-external quantum efficiency of the electroluminescent devices of Example 1 and Comparative Example 1, and FIG. 8 is a graph showing voltage-external quantum efficiency of the electroluminescent devices of Example 1 and Comparative Example 1.

Referring to FIG. 7, the electroluminescent device having a self-assembled monolayer of Example 1 shows improved external quantum efficiency and for example, about twice a maximum luminance of Comparative Example 1.

Referring to FIG. 8, the electroluminescent device having a self-assembled monolayer of Example 1 shows improved external quantum efficiency compared with that of Comparative Example 1. The electroluminescent device having a self-assembled monolayer of Example 1 exhibits about 0.1 volts (V) to 0.2 V increased driving voltage compared with that of Comparative Example 1. The driving voltage increase shown in FIG. 8 may not be regarded as a large difference in terms of display device driving efficiency.

Referring to FIGS. 7 and 8, the electroluminescent device of Example 1 minimizes a charge leakage path by filling a void, a crack, and the like of a ZnO cluster layer with a self-assembled monolayer, may prevent quenching of excitons, and show improved external quantum efficiency and luminance compared with that of Comparative Example 1.

Evaluation 2: Life-Span Characteristics of Electroluminescent Device

Figure 9:
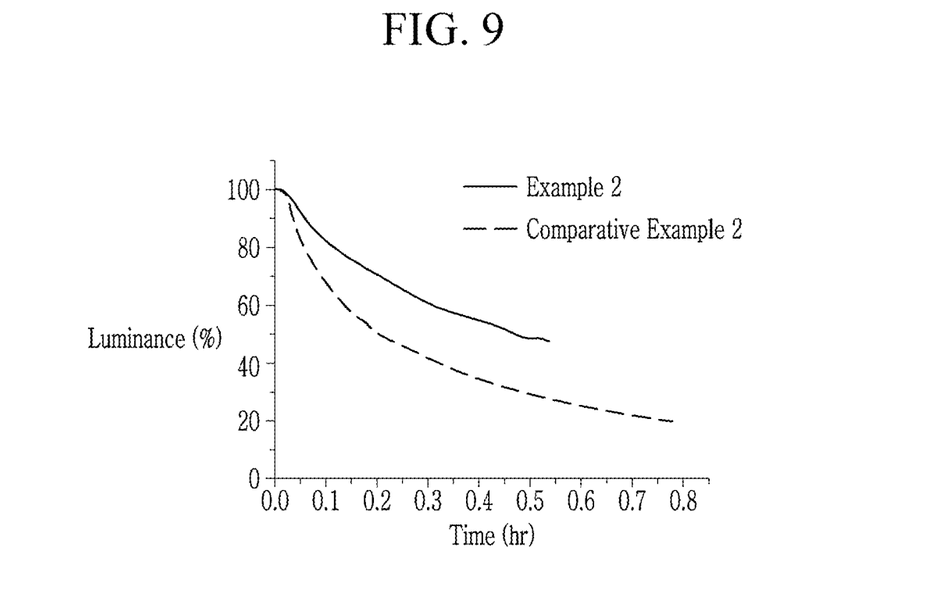
FIG. 9 is a graph of luminance (%) versus time (hours (hr)) showing life-span characteristics of the electroluminescent devices of Example 2 and Comparative Example 2.

A luminance change depending on time of the electroluminescent devices of Example 2 and Comparative Example 2 is shown in FIG. 9.

FIG. 9 is a graph showing life-span characteristics of the electroluminescent devices of Example 2 and Comparative Example 2. FIG. 9 shows decrease in luminance of an electroluminescent device depending on driving time, based on 100 nits of the initial luminance.

Referring to FIG. 9, for the electroluminescent device according to Comparative Example 2, after about 0.2 hours the luminance decreases to 50% of the initial luminance (i.e., 50 nits of luminance), and for the electroluminescent device of Example 2, the amount of time is about 0.5 hours under the same conditions.

FIG. 9 shows that the electroluminescent device of Example 2 minimizes a charge leakage path by filling a void, a crack, and the like of a ZnO cluster layer with a self-assembled monolayer and may exhibit about 2.5 times longer life-span compared with that of Comparative Example 2.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An electroluminescent device, comprising a first electrode;
an electron transport layer disposed on the first electrode and consisting of inorganic oxide particles;
a self-assembled monolayer disposed on the electron transport layer;
an emission layer disposed on the self-assembled monolayer and comprising light emitting particles;
a hole transport layer disposed on the emission layer; and
a second electrode disposed on the hole transport layer.

2. The electroluminescent device of claim 1, wherein the self-assembled monolayer comprises a self-assembled mono-molecule attached to an upper surface of the electron transport layer.

3. The electroluminescent device of claim 2, wherein the self-assembled monolayer consists of self-assembled mono-molecules.

4. The electroluminescent device of claim 2, wherein
the self-assembled mono-molecule has a first terminal end near the upper surface of the electron transport layer and a second terminal end farther from the upper surface of the electron transport layer and the first terminal end, and
the first terminal end and the upper surface of the electron transport layer are linked by a chemical bond.

5. The electroluminescent device of claim 4, wherein the chemical bond comprises a covalent bond, a hydrogen bond, or a combination thereof.

6. The electroluminescent device of claim 4, wherein the second terminal end comprises a C2 to C20 linear or branched alkyl group, an electron donating group, a hole blocking group, or a combination thereof.

7. The electroluminescent device of claim 6, wherein the second terminal end comprises the electron donating group, and the electron donating group comprises an amine group, a benzylamine group, an oxadiazole group, or a combination thereof.

8. The electroluminescent device of claim 6, wherein the second terminal end comprises the hole blocking group, and the hole blocking group comprises a triazine group, a triazole group, a quinoline group, a quinolone group, or a combination thereof.

9. The electroluminescent device of claim 2, wherein a length of the self-assembled mono-molecule is about 0.1 nanometers to about 10 nanometers.

10. The electroluminescent device of claim 2, wherein the self-assembled mono-molecule is soluble in a non-polar solvent.

11. The electroluminescent device of claim 10, wherein the non-polar solvent comprises at least one selected from a C6 to C20 linear or cyclic aliphatic hydrocarbon, a C5 to C20 aromatic hydrocarbon, chloroform, methylene chloride, ethyl acetate, or a combination thereof.

12. The electroluminescent device of claim 1, wherein an average thickness of the self-assembled monolayer is about 0.1 nanometers to about 5 nanometers.

13. The electroluminescent device of claim 1, wherein the inorganic oxide particles comprise $ZnO$, $TiO_2$, $ZrO_2$, $SnO_2$, $WO_3$, $Ta_2O_3$, or a combination thereof.

14. The electroluminescent device of claim 1, wherein the inorganic oxide particles are dispersible in a polar solvent.

15. The electroluminescent device of claim 1, wherein
an upper surface of the electron transport layer comprises a first space that is filled with the inorganic oxide particles and a second space that is not filled with the inorganic oxide particle, and
the self-assembled monolayer fills at least one part of the second space.

16. The electroluminescent device of claim 1, wherein the light emitting particles comprise quantum dots.

17. The electroluminescent device of claim 1, wherein the light emitting particles comprise a core-shell structure.

18. The electroluminescent device of claim 1, wherein light emitting particles comprise a Group II-VI compound that does not comprise Cd, a Group III-V compound, a Group IV-VI compound, a Group IV element or compound, a Group compound, a Group I—II-IV-VI compound that does not comprise Cd, or a combination thereof.

19. The electroluminescent device of claim 1, wherein the light emitting particles comprise a hydrophobic organic ligand.

20. A display device comprising the electroluminescent device of claim 1.

21. A method of forming an electroluminescent device, the method comprising
disposing an electron transport layer on a first electrode, the electron transport layer consisting of inorganic oxide particles;
disposing a self-assembled monolayer on the electron transport layer;
disposing an emission layer on the self-assembled monolayer, the emission layer comprising light emitting particles;
disposing a hole transport layer on the emission layer; and
disposing a second electrode on the hole transport layer to form the electroluminescent device.

22. An electroluminescent device, comprising
an electron transport layer consisting of inorganic oxide particles;
a self-assembled monolayer disposed on the electron transport layer, the self-assembled monolayer comprising mono-molecules attached to the inorganic oxide particles;
an emission layer disposed on the self-assembled monolayer and comprising light emitting particles, the light emitting particles comprising a Group II-VI compound that does not comprise Cd, a Group III-V compound, a Group IV-VI compound, a Group IV element or compound, a Group compound, a Group I-II-IV-VI compound that does not comprise Cd, or a combination thereof; and
a hole transport layer disposed on the emission layer.

23. The electroluminescent device of claim 22, wherein the mono-molecule comprises an ester and a C2 to C20 linear or branched alkyl group.

* * * * *